United States Patent
Son et al.

(10) Patent No.: US 10,553,361 B2
(45) Date of Patent: Feb. 4, 2020

(54) MULTILAYER CAPACITOR, METHOD OF MANUFACTURING THE SAME, AND BOARD HAVING THE SAME

(71) Applicant: SAMSUNG ELECTRO-MECHANICS CO., LTD., Suwon-si, Gyeonggi-do (KR)

(72) Inventors: Soo Hwan Son, Suwon-si (KR); Young Ghyu Ahn, Suwon-si (KR); Ho Yoon Kim, Suwon-si (KR)

(73) Assignee: SAMSUNG ELECTRO-MECHANICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 16/018,815

(22) Filed: Jun. 26, 2018

(65) Prior Publication Data

US 2019/0198248 A1    Jun. 27, 2019

(30) Foreign Application Priority Data

Dec. 22, 2017   (KR) .................. 10-2017-0178054

(51) Int. Cl.
*H01G 4/012*   (2006.01)
*H01G 4/232*   (2006.01)
(Continued)

(52) U.S. Cl.
CPC .............. *H01G 4/30* (2013.01); *H01G 4/012* (2013.01); *H01G 4/232* (2013.01); *H01G 4/248* (2013.01);
(Continued)

(58) Field of Classification Search
CPC ........ H01G 4/012; H01G 4/232; H01G 4/248; H01G 4/30; H01G 4/005; H01G 4/0085; H01G 4/12; H01G 4/35; H01G 4/1227; H05K 1/11; H05K 1/111; H05K 1/18; H05K 1/181; H05K 2201/10015; H05K 2201/10636; H05K 2201/2045; H05K 3/3442
(Continued)

(56) References Cited

U.S. PATENT DOCUMENTS

| 2013/0050894 A1 | 2/2013 | Ahn et al. |
| 2013/0319741 A1 | 12/2013 | Ahn et al. |

(Continued)

FOREIGN PATENT DOCUMENTS

| KR | 10-1309479 B1 | 9/2013 |
| KR | 10-1548773 B1 | 8/2015 |
| KR | 10-2017-0098560 A | 8/2017 |

*Primary Examiner* — Timothy J Thompson
*Assistant Examiner* — Guillermo J Egoavil
(74) *Attorney, Agent, or Firm* — Morgan, Lewis & Bockius LLP

(57) ABSTRACT

A multilayer capacitor includes: a capacitor body including an active region including a plurality of first and second internal electrodes alternately exposed, respectively, through opposite end surfaces of the capacitor body in a length direction, and upper and lower cover regions disposed on upper and lower surfaces of the active region, respectively; and first and second external electrodes formed on the opposite end surfaces of the capacitor body in the length direction, respectively. The lower cover region of the capacitor body may have a space portion.

12 Claims, 3 Drawing Sheets

(51) Int. Cl.
*H01G 4/248* (2006.01)
*H01G 4/30* (2006.01)
*H05K 1/11* (2006.01)
*H05K 1/18* (2006.01)
*H01G 4/12* (2006.01)

(52) U.S. Cl.
CPC ............ *H05K 1/111* (2013.01); *H05K 1/181* (2013.01); *H01G 4/1227* (2013.01); *H05K 2201/10015* (2013.01); *H05K 2201/2045* (2013.01)

(58) Field of Classification Search
USPC .......................................... 174/260; 361/313
See application file for complete search history.

(56) References Cited

U.S. PATENT DOCUMENTS

| | | | |
|---|---|---|---|
| 2015/0170841 A1* | 6/2015 | Ahn | H01G 4/30 174/260 |
| 2017/0243695 A1 | 8/2017 | Kim et al. | |
| 2018/0294102 A1* | 10/2018 | Trinh | H01G 4/30 |
| 2019/0180945 A1* | 6/2019 | Kim | H01G 4/40 |

* cited by examiner

I-I'

MULTILAYER CAPACITOR, METHOD OF MANUFACTURING THE SAME, AND BOARD HAVING THE SAME

CROSS-REFERENCE TO RELATED APPLICATION(S)

This application claims benefit of priority to Korean Patent Application No. 10-2017-0178054 filed on Dec. 22, 2017 in the Korean Intellectual Property Office, the disclosure of which is incorporated herein by reference in its entirety.

TECHNICAL FIELD

The present disclosure relates to a multilayer capacitor and a board having the same.

BACKGROUND

A multilayer capacitor, a multilayer electronic component, is mounted on the boards of various types of electronic products such as an image display device, for example, a liquid crystal display (LCD), a plasma display panel (PDP), or the like, a computer, a personal digital assistant (PDA), a cellular phone, or the like, to serve to charge or discharge electricity therein or therefrom.

The multilayer capacitor may be used as components of various electronic apparatuses since it is relatively small, implements a high capacitance, and is easily mounted.

The multilayer capacitor may have a structure in which internal electrodes having different polarities are alternately stacked between a plurality of dielectric layers.

Since the dielectric layer has piezoelectric and electrostrictive properties, a piezoelectric phenomenon may occur between the internal electrodes when a direct current (DC) or alternating current (AC) voltage is applied to the multilayer capacitor, such that vibrations may be generated.

These vibrations are transferred to a circuit board on which the multilayer capacitor is mounted through external electrodes of the multilayer capacitor, such that the entirety of the circuit board becomes a sound reflecting surface to generate a vibration sound, which is experienced as noise.

In this case, the vibration sound may correspond to an audio frequency range of 20 to 20,000 Hz making listeners uncomfortable, and the vibration sound making the persons uncomfortable as described above is known as acoustic noise.

Recently, due to a decrease in noise of components of electronic devices, the acoustic noise generated in the multilayer capacitor may be more prominent. Therefore, research into technology capable of effectively decreasing the acoustic noise generated in the multilayer capacitor has been required.

SUMMARY

An aspect of the present disclosure may provide a multilayer capacitor in which an acoustic noise decreasing effect may be further improved, and a board having the same.

According to an aspect of the present disclosure, a multilayer capacitor may include: a capacitor body including an active region including a plurality of first and second internal electrodes alternately exposed, respectively, through opposite end surfaces of the capacitor body in a length direction, and upper and lower cover regions disposed on upper and lower surfaces of the active region, respectively; and first and second external electrodes disposed on the opposite end surfaces of the capacitor body in the length direction, respectively. The lower cover region of the capacitor body may have a space portion.

A surface of the capacitor body adjacent to the space portion may be a mounting surface.

$0.5 \leq L1/L0 < 0.85$, where L1 is a length of the space portion in the length direction, and L0 is a length of the capacitor body in the length direction.

$0.5 \leq L1/L0 < 0.70$, where L1 is a length of the space portion in the length direction, and L0 is a length of the capacitor body in the length direction.

A thickness of the space portion may be 15 μm to 30 μm.

A distance between the space portion and a mounting surface of the capacitor body in a thickness direction along which the plurality of first and second internal electrodes are stacked may be 30 μm to 200 μm.

A length of the space portion in the length direction may be greater than a length of a portion in the length direction. The portion may be a portion in which the plurality of first and second internal electrodes overlap each other in a thickness direction along which the plurality of first and second internal electrodes are stacked.

A width of the space portion in a width direction may be greater than a width of a portion in the width direction. The portion may be a portion in which the plurality of first and second internal electrodes overlap each other in a thickness direction along which the plurality of first and second internal electrodes are stacked. The width direction may be perpendicular to the length direction and perpendicular to the thickness direction.

An area of the space portion may be greater than an area of a portion in which the plurality of first and second internal electrodes overlap each other in a thickness direction along which the plurality of first and second internal electrodes are stacked.

The lower cover region may have a thickness greater than that of the upper cover region.

The space portion may include a gas.

According to another aspect of the present disclosure, a board having a multilayer capacitor may include: a circuit board having first and second electrode pads disposed on an upper surface thereof; and the multilayer capacitor as described above mounted on the circuit board. The first and second external electrodes may be connected to the first and second electrode pads, respectively.

According to another aspect of the present disclosure, a multilayer capacitor may include: a capacitor body including an upper cover region and a lower cover region, and first and second internal electrodes disposed between the upper cover region and the lower cover region along a thickness direction and respectively exposed through opposite end surfaces of the capacitor body in a length direction; first and second external electrodes disposed on the opposite end surfaces of the capacitor body in the length direction and electrically connected to the first and second internal electrodes, respectively; and a gap containing a gas disposed in one of the upper cover region and the lower cover region having a thickness greater than another one of the upper cover region and the lower cover region.

$0.5 \leq L1/L0 < 0.85$, where L1 is a length of the gap in the length direction, and L0 is a length of the capacitor body in the length direction.

A thickness of the gap may be 15 μm to 30 μm.

A distance between the gap and a mounting surface of the capacitor body in the thickness direction may be 30 μm to 200 μm.

According to another aspect of the present disclosure, a method for manufacturing a multilayer capacitor may include: stacking first dielectric layers, on which a conductive paste including a conductive metal is coated; stacking second dielectric layers on and below the first dielectric layers, with a polymer resin layer disposed among the second dielectric layers, so as to form a body of the multilayer capacitor; sintering the body so as to remove the polymer resin layer, thereby converting a space occupied by the polymer resin layer to a gap; and forming external electrodes electrically connected to internal electrodes made of the conductive paste and exposed to end surfaces of the body in a length direction.

$0.5 \leq L1/L0 < 0.85$, where L1 is a length of the gap in the length direction, and L0 is a length of the body in the length direction. 19.

A thickness of the gap may be 15 μm to 30 μm.

A distance between the gap and a mounting surface of the body in a stacking direction of the first and second dielectric layers may be 30 μm to 200 μm.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Figure 1:
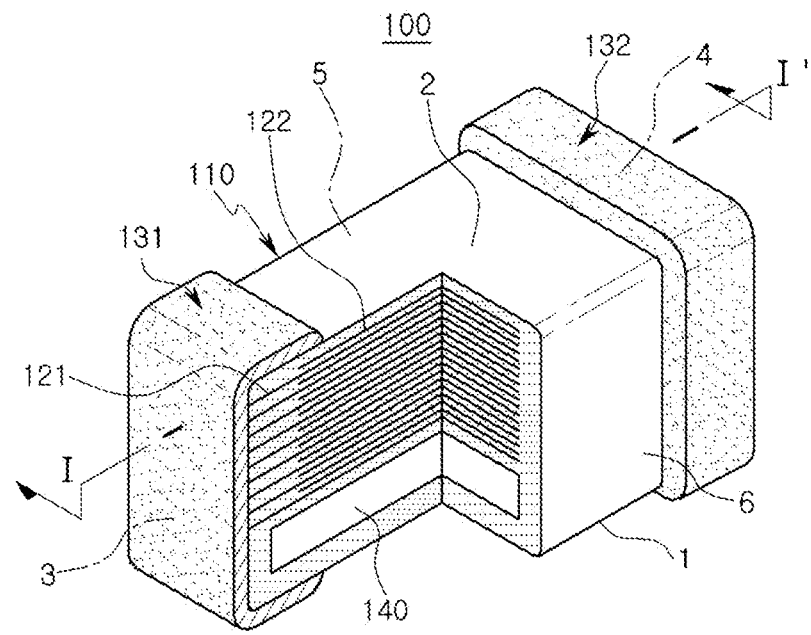
FIG. 1 is a schematic partially cut-away perspective view illustrating a multilayer capacitor according to an exemplary embodiment in the present disclosure.
Figure 2:
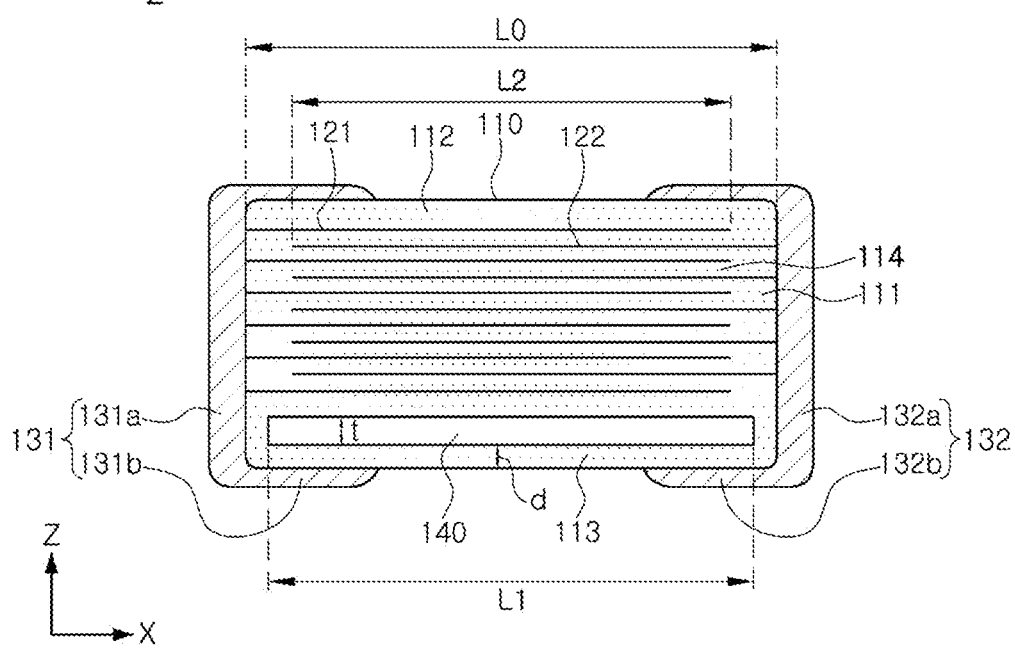
FIG. 2 is a cross-sectional view taken along line I-I' of FIG. 1.
Figure 3A:
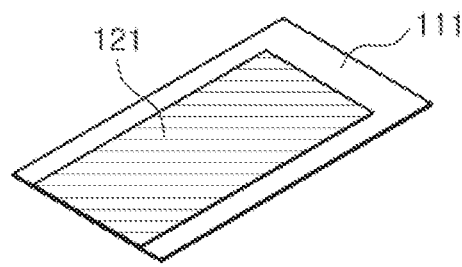
FIGS. 3A and 3B are perspective views illustrating, respectively, first and second internal electrodes of the multilayer capacitor of FIG. 1.
Figure 3B:
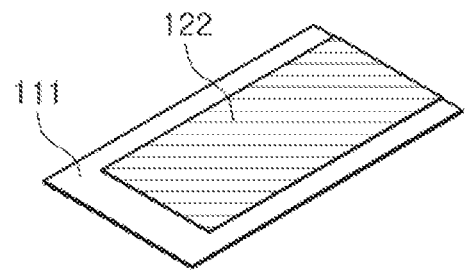

FIG. 1 is a schematic partially cut-away perspective view illustrating a multilayer capacitor according to an exemplary embodiment in the present disclosure, FIG. 2 is a cross-sectional view taken along line I-I' of FIG. 1, and FIGS. 3A and 3B are perspective views illustrating, respectively, first and second internal electrodes of the multilayer capacitor of FIG. 1.

Directions of a hexahedron will be defined in order to clearly describe exemplary embodiments in the present disclosure. X, Y and Z in the drawings refer to a length direction, a width direction, and a thickness direction of a capacitor body 110, respectively. Here, the thickness direction may be the same as a stacked direction in which dielectric layers 111 are stacked.

In addition, in the present exemplary embodiment, for convenience of explanation, first and second surfaces 1 and 2 of the capacitor body 110 refer to lower and upper surfaces of the capacitor body 110 in the Z direction, respectively, third and fourth surfaces 3 and 4 of the capacitor body 110 refers to opposite surfaces of the capacitor body 110 in the X direction, and fifth and sixth surfaces 5 and 6 of the capacitor body 110 refer to opposite surfaces of the capacitor body 110 in the Y direction.

Referring to FIGS. 1 through 3B, a multilayer capacitor 100 according to an exemplary embodiment in the present disclosure may include the capacitor body 110 and first and second external electrodes 131 and 132.

The capacitor body 110 may be formed by stacking and then sintering a plurality of dielectric layers 111, and a shape and a dimension of the capacitor body 110 and the number of stacked dielectric layers 111 are not limited to those illustrated in the present exemplary embodiment.

In addition, the plurality of dielectric layers 111 forming the capacitor body 110 may be in a sintered state, and adjacent dielectric layers 111 may be integrated with each other so that boundaries therebetween are not readily apparent without using a scanning electron microscope (SEM).

The capacitor body 110 may include an active region 114, an upper cover region 112 disposed on an upper surface of the active region 114, and a lower cover region 113 disposed on a lower surface of the active region 114.

A thickness of the lower cover region 113 may be greater than that of the upper cover region 112. In this case, a distance between a lowermost internal electrode among the internal electrodes 121 and 122 and the first surface 1 may be greater than a distance between an uppermost internal electrode among the internal electrodes 121 and 122 and the second surface 2.

In addition, a space portion 140 may be formed in the lower cover region 113 of the capacitor body 110. The space portion 140 may be a gap containing air or a gas having content different from air. A pressure inside the space portion 140 may be the same as or different from the standard atmosphere.

In addition, the first surface 1, which is a surface of the capacitor body 110 adjacent to the space portion 140 in the Z direction, of six surfaces of the capacitor body 110, may be a mounting surface.

The active region 114, which is a capacitance contributing portion, may be formed by repeatedly stacking a plurality of first and second internal electrodes 121 and 122 in the Z direction with one of the dielectric layers 111 interposed therebetween.

The dielectric layer 111 may include ceramic powders having a high dielectric constant, such as barium titanate ($BaTiO_3$) based powders or strontium titanate ($SrTiO_3$) based powders. However, a material of the dielectric layer 111 is not limited thereto.

The first and second internal electrodes 121 and 122, which are electrodes having different polarities, may be formed by printing a conductive paste including a conductive metal at a predetermined thickness on the dielectric layers 111, and may be disposed in the Z direction, which is the stacked direction of the dielectric layers 111, to be alternately exposed through the third and fourth surfaces 3 and 4 of the capacitor body 110, respectively.

In this case, the first and second internal electrodes 121 and 122 may be electrically insulated from each other by one of the dielectric layers 111 disposed therebetween.

In addition, the first and second internal electrodes 121 and 122 may be electrically connected to the first and second external electrodes 131 and 132, respectively, through portions thereof alternately exposed through the third and fourth surfaces 3 and 4 of the capacitor body 110, respectively.

Therefore, when voltages are applied to the first and second external electrodes 131 and 132, electric charges may be accumulated between the first and second internal electrodes 121 and 122 facing each other. In this case, a capacitance of the multilayer capacitor 100 may be in proportion to an area of a region in which the first and second internal electrodes 121 and 122 overlap each other.

In addition, the conductive metal included in the conductive paste forming the first and second internal electrodes 121 and 122 may be nickel (Ni), copper (Cu), palladium (Pd), or alloys thereof, but is not limited thereto.

A method of printing the conductive paste may be a screen printing method, a gravure printing method, or the like, but is not limited thereto.

The upper cover region 112 and the lower cover region 113 may be formed of the same material as that of the dielectric layers 111 and have the same configuration as that of the dielectric layers 111 except that they do not include the internal electrodes.

The upper cover region 112 and the lower cover region 113 may be formed by stacking a single dielectric layer or two or more dielectric layers on the upper and lower surfaces of the active region 114, respectively, in the Z direction. The upper cover region 112 and the lower cover region 113 may basically serve to prevent damage to the first and second internal electrodes 121 and 122 of the active region 114 due to physical or chemical stress.

The space portion 140 may be formed in the lower cover region 113 of the capacitor body 110, may extend in an X-Y plane, and may serve to absorb piezoelectric vibrations generated in the active region 114 of the capacitor body 110.

In order to form the space portion 140 in the capacitor body 110, a paste including a polymer resin may be first prepared, and a laminate in which a polymer resin layer is formed may be prepared by applying the paste between the active region 114 of the capacitor body 110 and the first surface 1, which the mounting surface of the capacitor body 110. The paste used to define the space portion 140 may be easily burned out in a sintering process and may be made of a material different from a paste containing ceramic powders used to form the dielectric layers 111. For example, the paste used to define the space portion 140 may include a polymer resin but not contain ceramic powders used to form the dielectric layers 111.

Then, when the laminate is sintered, the space portion 140 serving as an air gap may be formed in the lower cover region 113 of the capacitor body 110 while the polymer resin layer being removed. In a case in which the sintering is performed in a vacuum environment and at a temperate significantly higher than the room temperature, the space portion 140 formed by removing the polymer resin layer through the sintering process may be a vacuum. A gas content in the space portion 140 after the sintering process may be the same as or different from the air content.

A length L1 of the space portion 140 in the X direction may be greater than that of a portion in which the first and second internal electrodes 121 and 122 overlap each other in the active region 114. Although not shown, a width of the space portion 140 in the Y direction may be greater than that of the portion in which the first and second internal electrodes 121 and 122 overlap each other in the active region 114. In this case, an area of the portion in which the first and second internal electrodes 121 and 122 overlap each other may be less than an area of the space portion 140.

As a thickness t of the space portion 140 in the Z direction becomes large, an absorption effect of the piezoelectric vibrations generated in the active region 114 of the capacitor body 110 may be improved.

In the present exemplary embodiment, the thickness t of the space portion 140 may be 15 μm or more. When the thickness of the space portion 140 is less than 15 μm, an acoustic noise decreasing effect may be slight.

In addition, the thickness t of the space portion 140 may be 30 μm or less. When the thickness of the space portion 140 exceeds 30 μm, a region becoming an empty space in the lower cover region 113 is excessively large, such that the capacitor body 110 may become vulnerable to compressive stress and tensile stress.

Such a problem may decrease reliability of the multilayer capacitor, and cause a radial crack in the vicinity of the space portion 140 in the capacitor body 110.

In addition, a distance d between the first surface 1, which is the mounting surface of the capacitor body 110, and a lower end of the space portion 140 may be 30 μm to 200 μm.

When the distance d between the first surface 1 of the capacitor body 110 and the lower end of the space portion 140 is less than 30 μm, the capacitor body 110 may become vulnerable to stress, such that a crack may easily occur in the vicinity of the mounting surface of the capacitor body 110, and resistance of the capacitor body 110 against warpage of a circuit board at the time of mounting the multilayer capacitor on the circuit board becomes low, such that a warpage crack may easily occur in the capacitor body 110 after the multilayer capacitor is mounted on the circuit board.

When the distance between the first surface 1 of the capacitor body 110 and the lower end of the space portion 140 exceeds 200 μm, a thickness of a product may be excessively increased, such that a region corresponding to the space portion 140 absorbing acoustic noise becomes distant from the mounting surface, and an acoustic noise decreasing effect may thus be slight.

In addition, as the internal electrodes and the space portion become close to each other, a crack propagation occurrence ratio due to sintering shrinkage of the internal electrodes may be increased. Therefore, when the distance d between the first surface 1 of the capacitor body 110 and the lower end of the space portion 140 exceeds 200 μm, a reliability defect may more easily occur.

The first and second external electrodes 131 and 132 may be formed on opposite ends of the capacitor body 110 in the X direction, respectively.

The first electrode 131 may include a first connected portion 131a disposed on the third surface 3 of the capacitor body 110 and connected to the first internal electrodes 121 and a first band portion 131b extending from the first connected portion 131a to portions of the first, second, fifth, and sixth surfaces 1, 2, 5, and 6 of the capacitor body 110. The second external electrode 132 may include a second connected portion 132a disposed on the fourth surface 4 of the capacitor body 110 and connected to the second internal electrodes 122 and a second band portion 132b extending from the second connected portion 132a to portions of the first, second, fifth, and sixth surfaces 1, 2, 5, and 6 of the capacitor body 110.

The first and second external electrodes 131 and 132 may be formed of a conductive paste including a conductive metal.

The conductive metal may be nickel (Ni), copper (Cu), palladium (Pd), gold (Au), or alloys thereof, but is not limited thereto.

In addition, plating layers may be formed on surfaces of the first and second external electrodes 131 and 132, if necessary.

For example, the first and second external electrodes 131 and 132 may include first and second conductive layers, first and second nickel (Ni) plating layers formed on the first and second conductive layers, and first and second tin (Sn) plating layers formed on the first and second nickel plating layers, respectively.

Meanwhile, in the present exemplary embodiment, $0.5 \le L1/L0 < 0.85$, where L1 is a length of the space portion 140 and L0 is a length of the capacitor body 100. In one embodiment, a maximum value of L1/L0 may be 0.70 or less. In one embodiment, L1<L2, in which L2 is a length of a portion in which the first and second internal electrodes 121 and 122 overlap each other in the thickness direction Z along which the first and second internal electrodes 121 and 122 are stacked.

Table 1 represents a change in acoustic noise depending on the ratio of the length L1 of the space portion 140 to the length L0 of the capacitor body 110 and the thickness t of the space portion 140. Here, in Sample 1 in which the space portion does not exist, acoustic noise was 34 dBA, and an acceptance reference value of acoustic noise was thus set to 30.6 dBA lower than 34 dBA by 10%.

TABLE 1

| # | L1/L0 | t (μm) | Acoustic noise [dBA] | Occurrence of Crack |
|---|-------|--------|----------------------|---------------------|
| 1 | — | 0 | 34.0 | □ |
| 2 | 0.45 | 5 | 32.8 | □ |
| 3 | 0.50 | 10 | 30.5 | □ |
| 4 | 0.60 | 10 | 29.8 | □ |
| 5 | 0.60 | 20 | 28.4 | □ |
| 6 | 0.65 | 20 | 27.2 | □ |
| 7 | 0.70 | 20 | 25.9 | □ |
| 8 | 0.70 | 30 | 24.3 | □ |
| 9 | 0.75 | 30 | 24.5 | □ |
| 10 | 0.80 | 30 | 26.2 | □ |
| 11 | 0.80 | 40 | 26.1 | □ |
| 12 | 0.85 | 40 | 27.1 | ○ |
| 13 | 0.90 | 40 | 27.2 | ○ |

Referring to Table 1, it may be confirmed that in Samples 3 to 11 in which the ratio (L1/L0) is 0.5 or more and is less than 0.85, acoustic noise was 30.6 dBA or less and a crack did not occur. In Sample 2 in which L1/L0 is less than 0.5, acoustic noise was 32.8 dBA, which is higher than the acceptance reference value, and a crack did not occur. In Samples 12 and 13 in which L1/L0 is 0.85 or more, acoustic noise was the acceptance reference value or less, but a crack occurred. Therefore, a preferable numerical range of L1/L0 according to the present exemplary embodiment may be 0.5 or more and be less than 0.85.

In addition, it may be confirmed that in Sample 9 in which L1/L0 is 0.75, acoustic noise was further increased as compared to Sample 8 in which L1/L0 is 0.70. Therefore, a more preferable range of L1/L0 may be 0.70 or less.

In addition, it may be confirmed that in a case in which ratios (L1/L0) are the same as each other, when t is relatively greater, acoustic noise was further decreased.

Figure 4:
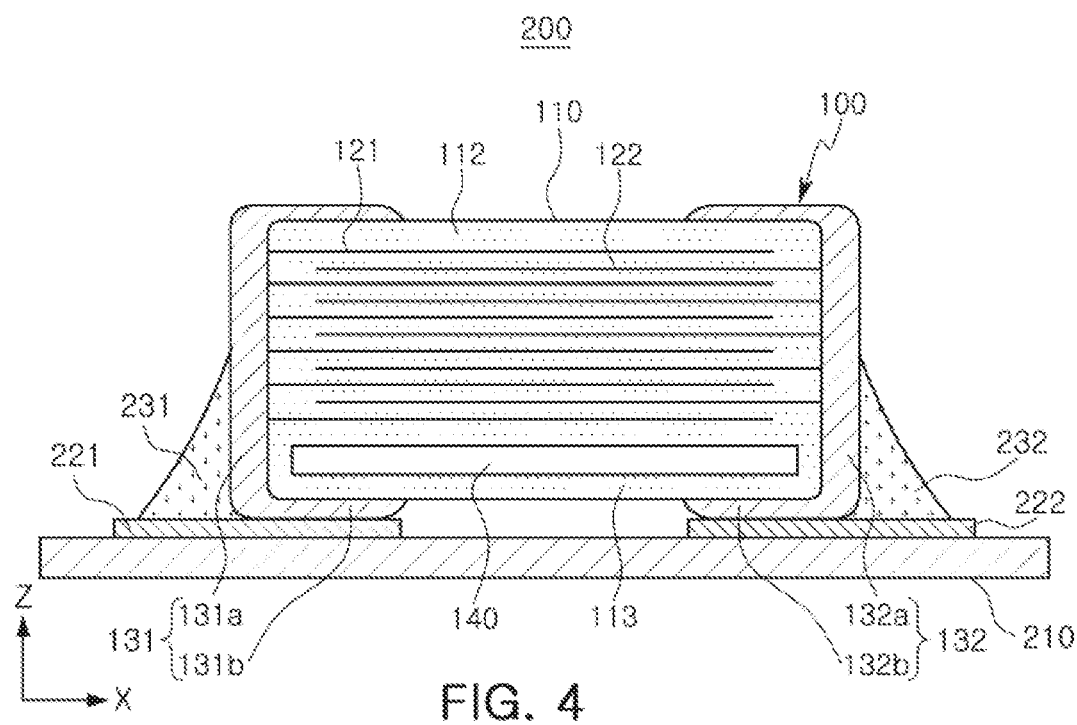
FIG. 4 is a cross-sectional view illustrating a state in which the multilayer capacitor of FIG. 1 is mounted on a circuit board.

FIG. 4 is a cross-sectional view illustrating a state in which the multilayer capacitor of FIG. 1 is mounted on a circuit board.

Referring to FIG. 4, a board 200 having a multilayer capacitor 100 according to the present exemplary embodiment may include a circuit board 210 on which the multilayer capacitor 100 is mounted and first and second electrode pads 221 and 222 formed on an upper surface of the circuit board 210 to be spaced apart from each other in the X direction.

In this case, the multilayer capacitor 100 may be electrically connected to the circuit board 210 by solders 231 and 232 in a state in which lower surfaces of the band portions 131b and 132b of the first and second external electrodes 131 and 132 of the multilayer capacitor 100 are disposed on the first and second electrode pads 221 and 222, respectively, to be connected to the first and second electrode pads 221 and 222, respectively.

Figure 5:
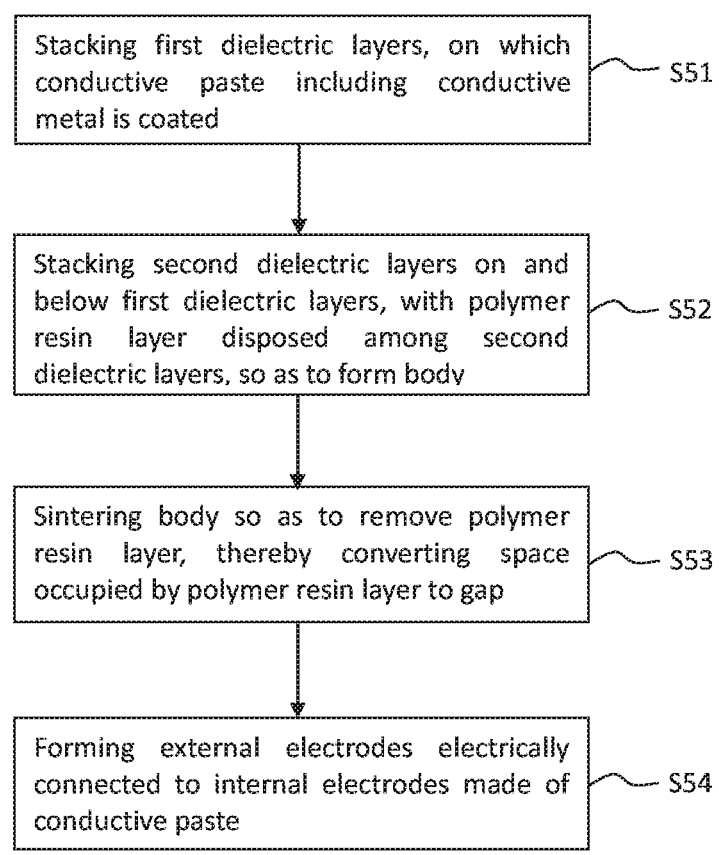
FIG. 5 is a flowchart showing process steps of a method for manufacturing the multilayer capacitor of FIG. 1.

FIG. 5 is a flowchart showing process steps of a method for manufacturing the multilayer capacitor of FIG. 1.

The method may include stacking first dielectric layers, on which a conductive paste including a conductive metal is coated (S51); stacking second dielectric layers on and below the first dielectric layers, as an upper cover region and a lower cover region, with a polymer resin layer disposed among the second dielectric layers, so as to form a body of the multilayer capacitor (S52); sintering the body so as to remove the polymer resin layer, thereby converting a space occupied by the polymer resin layer to a gap (S53); and forming external electrodes electrically connected to internal electrodes made of the conductive paste and exposed to end surfaces of the body in a length direction (S54). The order to stack the first and second dielectric layers may be modified according to design particulars.

As set forth above, according to the exemplary embodiment in the present disclosure, the vibrations generated in the multilayer capacitor may be decreased to further decrease the acoustic noise generated in the circuit board due to the vibrations.

While exemplary embodiments have been shown and described above, it will be apparent to those skilled in the art that modifications and variations could be made without departing from the scope of the present invention as defined by the appended claims.

What is claimed is:

1. A multilayer capacitor comprising:
   a capacitor body including an active region including a plurality of first and second internal electrodes alternately exposed, respectively, through opposite end surfaces of the capacitor body in a length direction, and upper and lower cover regions disposed on upper and lower surfaces of the active region, respectively; and
   first and second external electrodes disposed on the opposite end surfaces of the capacitor body in the length direction and electrically connected to the first and second internal electrodes, respectively,
   wherein the lower cover region of the capacitor body has a space portion including a gas, and
   the gas is spaced apart from the plurality of first and second internal electrodes.

2. The multilayer capacitor of claim 1, wherein a surface of the capacitor body adjacent to the space portion is a mounting surface.

3. A multilayer capacitor comprising:
   a capacitor body including an active region including first and second internal electrodes alternately exposed, respectively, through opposite end surfaces of the capacitor body in a length direction, and upper and lower cover regions disposed on upper and lower surfaces of the active region, respectively; and
   first and second external electrodes disposed on the opposite end surfaces of the capacitor body in the length direction and electrically connected to the first and second internal electrodes, respectively,
   wherein the lower cover region of the capacitor body has a space portion, and
   $0.5 \le L1/L0 < 0.85$, where L1 is a length of the space portion in the length direction, and L0 is a length of the capacitor body in the length direction.

4. The multilayer capacitor of claim 1, wherein $0.5 \leq L1/L0 < 0.70$, where L1 is a length of the space portion in the length direction, and L0 is a length of the capacitor body in the length direction.

5. The multilayer capacitor of claim 1, wherein a thickness of the space portion is 15 μm to 30 μm.

6. A multilayer capacitor comprising:
a capacitor body including an active region including first and second internal electrodes alternately exposed, respectively, through opposite end surfaces of the capacitor body in a length direction, and upper and lower cover regions disposed on upper and lower surfaces of the active region, respectively; and
first and second external electrodes disposed on the opposite end surfaces of the capacitor body in the length direction and electrically connected to the first and second internal electrodes, respectively,
wherein the lower cover region of the capacitor body has a space portion, and
a distance between the space portion and a mounting surface of the capacitor body in a thickness direction along which the plurality of first and second internal electrodes are stacked is 30 μm to 200 μm.

7. The multilayer capacitor of claim 1, wherein a length of the space portion in the length direction is greater than a length of a portion in the length direction, the portion being a portion in which the plurality of first and second internal electrodes overlap each other in a thickness direction along which the plurality of first and second internal electrodes are stacked.

8. The multilayer capacitor of claim 1, wherein a width of the space portion in a width direction is greater than a width of a portion in the width direction, the portion being a portion in which the plurality of first and second internal electrodes overlap each other in a thickness direction along which the plurality of first and second internal electrodes are stacked, and the width direction being perpendicular to the length direction and perpendicular to the thickness direction.

9. The multilayer capacitor of claim 6, wherein a length, in the length direction, of the space portion is greater than a length of a portion in which the plurality of first and second internal electrodes overlap each other in a thickness direction along which the plurality of first and second internal electrodes are stacked.

10. The multilayer capacitor of claim 1, wherein the lower cover region has a thickness greater than that of the upper cover region.

11. A board having a multilayer capacitor, comprising:
a circuit board having first and second electrode pads disposed on an upper surface thereof; and
the multilayer capacitor of claim 1 mounted on the circuit board,
wherein the first and second external electrodes are connected to the first and second electrode pads, respectively.

12. The multilayer capacitor of claim 1, wherein the gas is spaced apart from the active region.

* * * * *